(12) United States Patent
Watanabe et al.

(10) Patent No.: US 12,238,897 B2
(45) Date of Patent: Feb. 25, 2025

(54) HEAT DISSIPATION STRUCTURE, METHOD FOR MANUFACTURING HEAT DISSIPATION STRUCTURE, AND ELECTRONIC APPARATUS

(71) Applicant: Lenovo (Singapore) Pte. Ltd., Singapore (SG)

(72) Inventors: Ryota Watanabe, Kanagawa (JP); Masahiro Kitamura, Kanagawa (JP); Mizuki Itoyama, Kanagawa (JP); Takuroh Kamimura, Kanagawa (JP); Junrong Zhou, Beijing (CN)

(73) Assignee: Lenovo (Singapore) Pte. Ltd., Singapore (SG)

( * ) Notice: Subject to any disclaimer, the term of this patent is extended or adjusted under 35 U.S.C. 154(b) by 226 days.

(21) Appl. No.: 18/079,375

(22) Filed: Dec. 12, 2022

(65) Prior Publication Data
US 2023/0240047 A1  Jul. 27, 2023

(30) Foreign Application Priority Data

Jan. 7, 2022  (JP) ................................ 2022-001927

(51) Int. Cl.
*H05K 7/20* (2006.01)
*G06F 1/20* (2006.01)

(52) U.S. Cl.
CPC ........... *H05K 7/2039* (2013.01); *G06F 1/206* (2013.01)

(58) Field of Classification Search
CPC ....... H05K 7/2039; G06F 1/206; H01L 23/42; H01L 2023/4068; H01L 23/3736; H01L 23/3733
See application file for complete search history.

(56) References Cited

U.S. PATENT DOCUMENTS

| | | | | |
|---|---|---|---|---|
| 5,561,590 A | * | 10/1996 | Norell | .................. H01L 23/3736 |
| | | | | 165/185 |
| 5,658,831 A | * | 8/1997 | Layton | ..................... H01L 24/28 |
| | | | | 257/E23.09 |
| 10,514,214 B2 | * | 12/2019 | Baldwin | ............... F28F 13/003 |
| 10,741,474 B2 | * | 8/2020 | Stegmeier | ............. H01L 23/427 |
| 11,037,862 B2 | * | 6/2021 | Baueregger | ............ C25D 21/14 |
| 11,963,333 B2 | * | 4/2024 | Kitamura | ........... H05K 7/20336 |

(Continued)

FOREIGN PATENT DOCUMENTS

| | | |
|---|---|---|
| JP | S55-48953 A | 4/1980 |
| JP | H08-508611 A | 9/1996 |

(Continued)

OTHER PUBLICATIONS

Extended European Search Report issued in corresponding European Patent Application No. EP 22209077.1 dated Jun. 6, 2023 (72 pages).

*Primary Examiner* — Lisa Lea-Edmonds

(74) *Attorney, Agent, or Firm* — Osha Bergman Watanabe & Burton LLP

(57) ABSTRACT

A heat dissipation structure, for a heat-generating electric component, includes: a heat dissipator disposed along a surface of the electric component; and a porous material held between the electric component and the heat dissipator. The porous material of the heat dissipation structure is impregnated with heat-transfer fluid. The heat-transfer fluid may include liquid metal.

11 Claims, 5 Drawing Sheets

(56) References Cited

U.S. PATENT DOCUMENTS

| | | | |
|---|---|---|---|
| 2002/0108743 A1* | 8/2002 | Wirtz | H01L 23/3733 |
| | | | 257/722 |
| 2005/0155752 A1 | 7/2005 | Larson et al. | |
| 2006/0146503 A1* | 7/2006 | Kubo | H01L 23/3675 |
| | | | 361/720 |
| 2006/0157223 A1 | 7/2006 | Gelorme et al. | |
| 2017/0307308 A1* | 10/2017 | Baldwin | H01L 23/3733 |
| 2018/0162098 A1 | 6/2018 | Joo | |
| 2018/0301392 A1* | 10/2018 | Stegmeier | H01L 24/84 |
| 2021/0136956 A1* | 5/2021 | Paavola | B23P 15/26 |
| 2021/0337696 A1* | 10/2021 | Lin | H05K 7/205 |
| 2022/0375816 A1* | 11/2022 | Berntson | C09K 5/10 |
| 2023/0180441 A1* | 6/2023 | Lin | H05K 1/0204 |
| | | | 361/720 |
| 2023/0207419 A1* | 6/2023 | Kitamura | H01L 23/3736 |
| 2023/0240047 A1* | 7/2023 | Watanabe | H01L 23/42 |
| | | | 361/679.54 |
| 2023/0361071 A1* | 11/2023 | Zinn | H01L 23/3677 |
| 2023/0403823 A1* | 12/2023 | Kitamura | H01L 23/427 |
| 2024/0014098 A1* | 1/2024 | Watanabe | H01L 23/427 |
| 2024/0038710 A1* | 2/2024 | Hashiba | H01L 23/4275 |
| 2024/0121916 A1* | 4/2024 | Kitamura | G06F 1/203 |
| 2024/0258198 A1* | 8/2024 | Wang | H01L 23/42 |

FOREIGN PATENT DOCUMENTS

| | | |
|---|---|---|
| JP | 2003-332505 A | 11/2003 |
| JP | 2004-146819 A | 5/2004 |
| JP | 2008-527737 A | 7/2008 |
| JP | 2008-205383 A | 9/2008 |

\* cited by examiner

HEAT DISSIPATION STRUCTURE, METHOD FOR MANUFACTURING HEAT DISSIPATION STRUCTURE, AND ELECTRONIC APPARATUS

CROSS-REFERENCE TO RELATED APPLICATIONS

This application claims priority to Japanese Patent Application No. 2022-001927 filed on Jan. 7, 2022, the contents of which are hereby incorporated herein by reference in their entirety.

TECHNICAL FIELD

The present invention relates to a heat dissipation structure for a heat-generating electric component, a method for manufacturing the heat dissipation structure, and an electronic apparatus.

BACKGROUND

Portable information apparatuses such as laptop PCs are provided with semiconductor chips such as GPUs and CPUs. GPUs and CPUs include a substrate, which is a portion to be mounted on a board, and a rectangular die on the surface of the substrate. Small capacitors may be provided around the die on the surface of the substrate.

Semiconductor chips such as GPUs and CPUs are heat-generating elements, and for a certain level of power consumption (especially at high load), they may require heat dissipation. To dissipate heat from GPUs and CPUs, heat dissipators such as a vapor chamber, a heat spreader, and a heat sink may be used, and the heat may be diffused through this heat dissipator that is in contact with the surface of the die. Fluid such as liquid metal or heat-transfer grease may be interposed between the die and the heat dissipator to efficiently transfer the heat (e.g., Japanese Unexamined Patent Application Publication No. 2004-146819).

Liquid metal has a higher thermal conductivity than heat-transfer grease and effectively transfers heat from the die to the heat dissipator. Liquid metal has another feature of higher fluidity than heat-transfer grease. Electronic apparatuses are susceptible to vibrations and shocks when carried and moved. Thus, liquid metal having fluidity may leak out of the gap between the die and the heat dissipator due to repetitive forces applied from the die and the heat dissipator.

Some liquid metals are gallium-based and may react chemically with copper and solder. Liquid metal is electrically conductive, meaning that if it leaks and touches electrical elements such as capacitors in the vicinity, it will short-circuit. Some countermeasures therefore will be necessary. As a countermeasure, an insulating wall may be provided between the electric element and the die on the substrate. However, if the electric element and the die are close to each other, there will be no space enough to place the insulating wall. The leakage reduces the amount of liquid metal between the die and the heat dissipator. This may degrade the heat-transfer performance.

SUMMARY

In view of the above, embodiments of the present invention provide a heat dissipation structure, a method for manufacturing the heat dissipation structure, and an electronic apparatus capable of preventing a decrease in heat-transfer performance between a heat-generating electric component and a heat dissipator.

A heat dissipation structure according to one or more embodiments of the present invention is for a heat-generating electric component, and includes: a heat dissipator disposed along a surface of the electric component; and a porous material held between the electric component and the heat dissipator, the porous material being impregnated with heat-transfer fluid. This configuration allows the porous material to hold the heat-transfer fluid, thus preventing a leakage of the heat-transfer fluid and a decrease in heat-transfer performance between the heat-generating electric component and the heat dissipator.

The heat-transfer fluid may include liquid metal. Liquid metal provides more favorable heat-transfer performance.

The porous material may include a metal material, and may include nickel at least on the surface. This prevents alteration of the porous material.

The porous material may include a mesh.

The porous material may include a sponge.

The heat dissipation structure further may include a board and a semiconductor chip mounted on the board. The semiconductor chip may include a substrate and a die, and the electric component may include the die. This effectively cools the die, which is one of the most heat-generating electric components in information apparatuses.

An electronic apparatus according to one or more embodiments of the present invention includes the above-described heat dissipation structure.

A method for manufacturing a heat dissipation structure according to one or more embodiments of the present invention manufactures a heat dissipation structure for a heat-generating electric component. The method includes: an impregnation step of impregnating a porous material with heat-transfer fluid; a placing step of placing the porous material impregnated with the heat-transfer fluid on a surface of the electric component; and a holding step of bringing a heat dissipator into contact with the porous material and holding the porous material between the heat dissipator and the electric component. This method enables sufficient impregnation of the porous material with the heat-transfer fluid.

The method may include, prior to the placing step, a step of applying the heat-transfer fluid to the surface of the electric component. This method ensures that the heat-transfer fluid, with which the porous material is impregnated, comes in contact with the surface of the electric component.

The method may include, prior to the holding step, a step of applying the heat-transfer fluid to the surface of the heat dissipator. This method ensures that the heat-transfer fluid, with which the porous material is impregnated, comes in contact with the surface of the heat dissipator.

One or more embodiments of the present invention allow the porous material to be impregnated with the heat-transfer fluid for holding, thus preventing a leakage of the fluid and a decrease in heat-transfer performance between the heat-generating electric component and the heat dissipator.

DETAILED DESCRIPTION

The following describes embodiments of a heat dissipation structure, a method for manufacturing a heat dissipation structure, and an electronic apparatus according to the present invention in details, with reference to the drawings. The present invention is not limited to the following embodiments.

Figure 1:
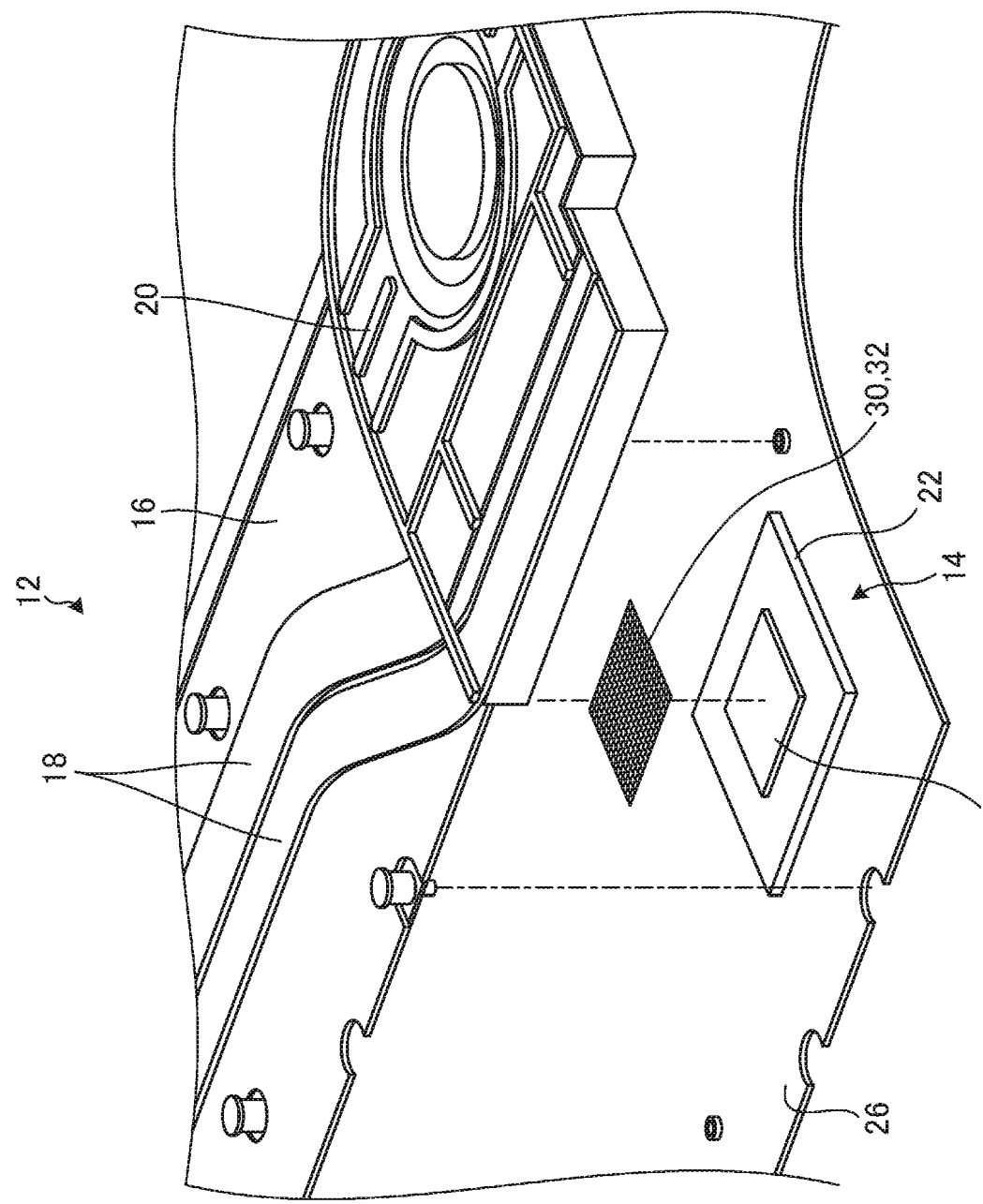
FIG. 1 is an exploded perspective view partially illustrating a heat dissipation structure and a portable information apparatus according to one or more embodiments of the present invention.

FIG. 1 is an exploded perspective view partially illustrating a heat dissipation structure 10 and a portable information apparatus 12 according to one or more embodiments of the present invention.

The portable information apparatus (electronic apparatus) 12 may be a laptop PC, a tablet terminal, or a smartphone, for example, which includes a graphics processing unit (GPU) 14. The heat dissipation structure 10 may be used for the portable information apparatus 12, and it can also be applied to other electronic apparatuses such as stationary desktop computers. The GPU 14 is a semiconductor chip capable of real-time image processing. The GPU 14, which generates a considerable amount of heat due to the high-speed calculation, requires heat dissipation. The portable information apparatus 12 includes a vapor chamber (heat dissipator) 16 for heat dissipation from the GPU 14.

The vapor chamber 16 has a plate-like shape and includes two metal plates (e.g., copper plates) that are joined at their peripheral edges to define a closed space inside the plates. The vapor chamber 16 diffuses heat efficiently through the phase change of working fluid enclosed in the closed space. In the closed space of the vapor chamber 16, a wick is provided, which sends the condensed working fluid by capillarity.

The vapor chamber 16 is provided with substantially parallel two heat pipes 18, and the ends of these heat pipes 18 are connected to a fan 20. The heat pipes 18 each include a flattened thin metal pipe, inside of which a closed space is defined, and working fluid is enclosed in the closed space. Like the vapor chamber 16, the heat pipes 18 are provided with a wick.

Various heat dissipators other than the vapor chamber 16 may be used for heat dissipation from heat-generating elements such as the GPU 14. Heat dissipators include, for example, metal plates with high thermal conductivity such as copper and aluminum, graphite plates, heatlanes, and heat sinks.

Figure 2:
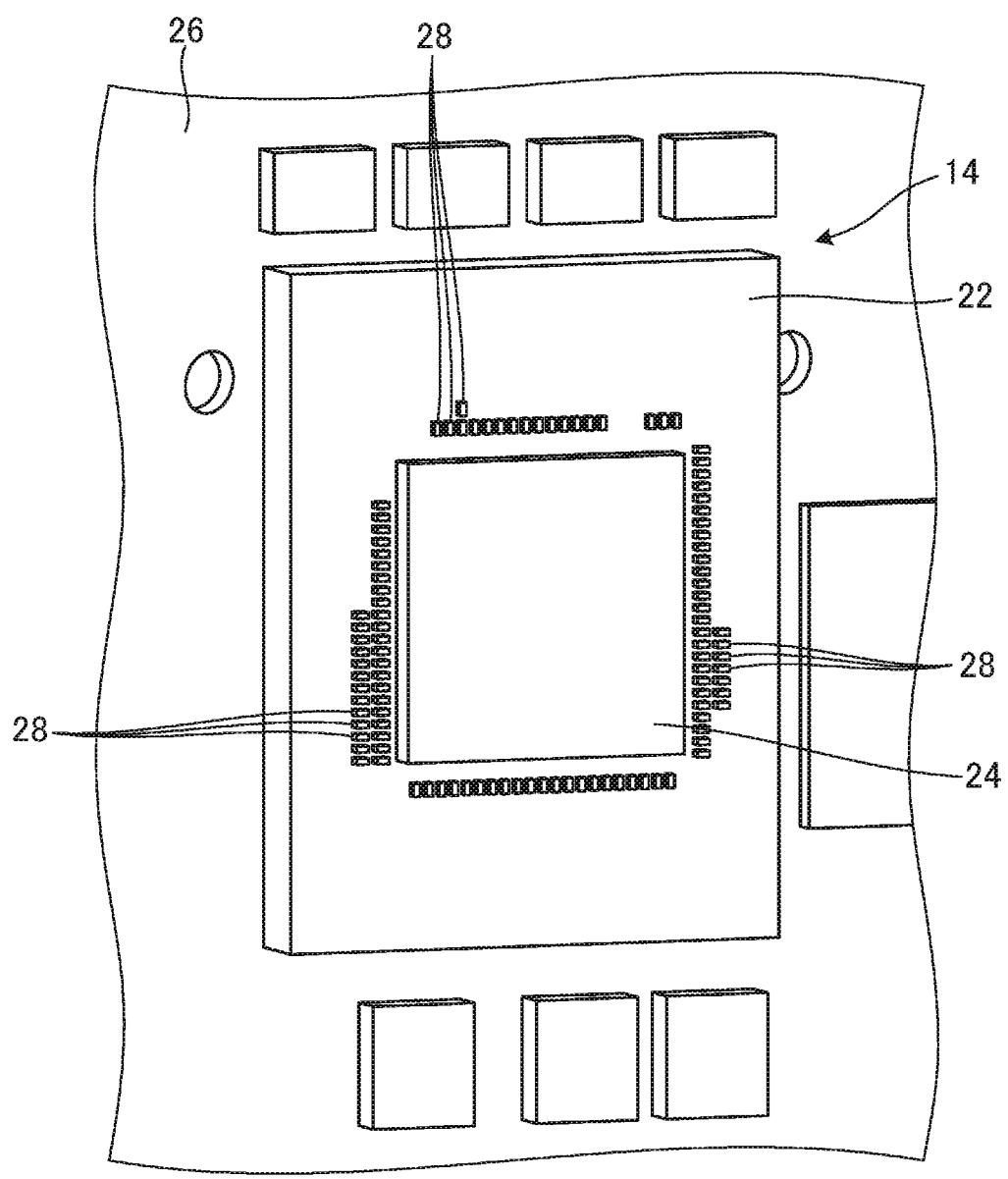
FIG. 2 is a perspective view of a GPU.

FIG. 2 is a perspective view of the GPU 14. FIG. 2 omits the components of the heat dissipation structure 10. The GPU 14 has a substrate 22 and a die (electric component) 24. The substrate 22 is a thin plate-like portion mounted on a board 26, and has a rectangular shape in plan view. The die 24 is a part including an arithmetic circuit, and slightly protrudes from the upper surface of the substrate 22. The die 24 has a rectangular shape smaller than the substrate 22 in plan view, and is located substantially in the center of the upper surface of the substrate 22. The GPU 14 is one of the components that generate the most heat in the portable information apparatus 12, and the die 24 in particular generates heat. In other words, the die 24 is one of the electric components that generates the most heat in the portable information apparatus 12. The portable information apparatus 12 also includes a central processing unit (CPU). Like the GPU, the CPU has a substrate and a die, and the heat dissipation structure 10 can be used for the CPU. The heat dissipation structure 10 is also applicable to heat dissipation from semiconductor chips other than the GPU 14 and the CPU, or other heat-generating electric components.

On the upper surface of the substrate 22, many small capacitors 28 are arranged to surround the die 24. These capacitors 28 are arranged on the four sides of the die 24 in one lines or in two lines at some locations. These capacitors 28 are located relatively close to the die 24. The height of the capacitors 28 is lower than the die 24.

Figure 3:
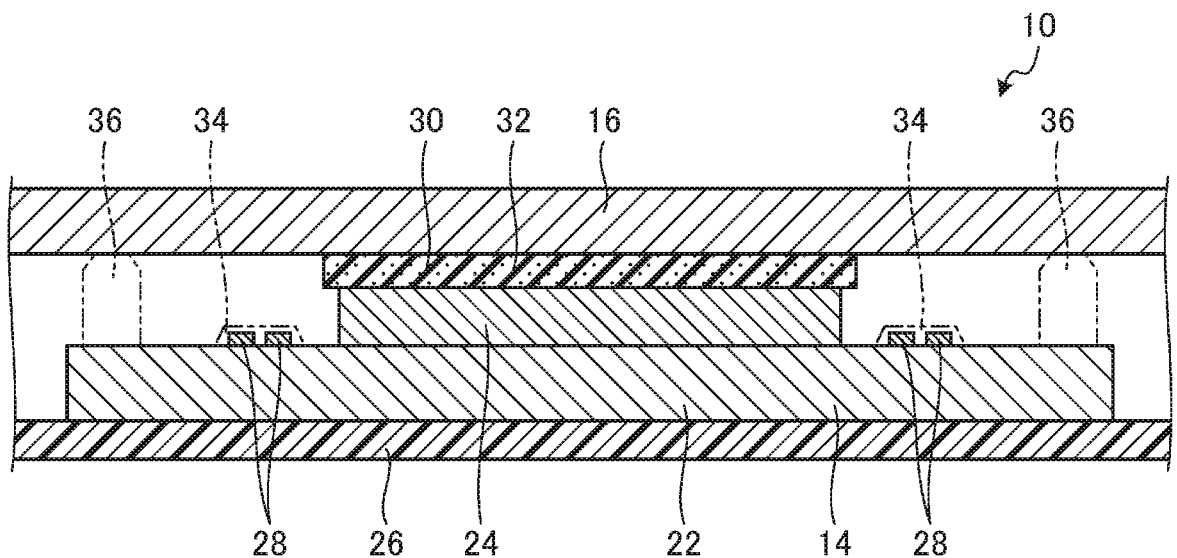
FIG. 3 is a schematic cross-sectional side view of a heat dissipation structure according to one or more embodiments of the present invention.

FIG. 3 is a schematic cross-sectional side view of the heat dissipation structure 10 according to one or more embodiments of the present invention. The heat dissipation structure 10 has the vapor chamber 16 described above and a mesh (porous material) 30 placed between the vapor chamber 16 and the surface of the die 24. The mesh 30 is impregnated with liquid metal (heat-transfer fluid) 32.

The liquid metal 32 is essentially metal that is liquid at room temperatures, and it may be liquid at least at the temperatures of normal use where the board 26 of the portable information apparatus 12 is energized and the GPU 14 is in operation. The liquid metal 32, which is metal, has excellent thermal conductivity and electrical conductivity. Also, the liquid metal 32, which is liquid, has fluidity.

Essentially the entire width of the mesh 30 is impregnated with the liquid metal 32, so that the liquid metal 32 comes in contact with the surfaces of the die 24 and the vapor chamber 16, establishing a good thermal connection between them. Essentially the entire surface of the mesh 30 is impregnated with the liquid metal 32, and under some conditions, some portions of the mesh 30 (e.g., the edges) may not be impregnated to keep room for absorbing an extra amount.

The mesh 30 has a rectangular shape that is the same as or slightly larger than the surface of the die 24 to cover the surface of the die 24. The mesh 30 may have some small holes depending on the heat generation distribution in the die 24, and the holes may serve as a liquid reservoir for the liquid metal 32.

The mesh 30 may be made of woven wire or a plate material with a large number of holes etched into it. Although the mesh 30 may be made of a resin material, for example, the mesh 30 made of a metal material will have a suitable heat transfer performance. When the mesh 30 is made of a metal material, a nickel material (including an alloy containing nickel as a main component) or a copper or aluminum material plated with nickel may be used. That is, the mesh 30 may be made of a nickel material at least on the surface. This can prevent the alteration by the liquid metal 32. The mesh 30 made of a nickel material omits the plating process. The mesh 30 made of a copper or aluminum material plated with nickel has favorable thermal conductivity.

The mesh 30 may be replaced by other porous materials that can be impregnated with liquid metal 32, such as sponges or other foams. A porous material in the present application refers to a material that can be impregnated with a heat-transfer fluid such as the liquid metal 32, regardless of resin, metal, or the like. The sponge as a porous material may be either resin or metal (like a metal scourer). The porous material in the present application may be either an elastic body or a rigid body.

The vapor chamber 16 is essentially placed in parallel with the surface of the die 24. As long as the vapor chamber 16 may be placed so as to come in contact with the entire surface of the mesh 30 (or the sponge), the vapor chamber 16 may be slightly non-parallel (substantially parallel) due to slight elastic deformation or uneven thickness of the mesh 30. FIG. 3 does not illustrate a single layer of the liquid metal 32 because the mesh 30 is impregnated with the liquid metal 32. Microscopically, the layer of the liquid metal 32 may exist between the die 24 and the mesh 30, or between the die 24 and the vapor chamber 16.

These heat dissipation structure 10 and portable information apparatus 12 have favorable heat transfer performance because the die 24 and the vapor chamber 16 are thermally connected by the liquid metal 32, with which the mesh 30 is impregnated. While the portable information apparatus 12 is carried and moved, it may be subjected to vibrations or shocks, so that pressure is applied to the liquid metal 32 repeatedly from the die 24 and vapor chamber 16. Although having fluidity, the liquid metal 32, with which the mesh 30 is impregnated, keeps impregnation due to the wettability with the mesh 30 and other factors, and thus it does not leak into the surroundings.

For this reason, an appropriate amount of the liquid metal 32 is held between the die 24 and the vapor chamber 16, thus preventing deterioration of heat transfer performance. This also prevents the liquid metal 32 from touching the capacitors 28 and other electric components mounted on the board 26.

The liquid metal 32 essentially does not touch the capacitors 28, meaning that no insulating material 34 (illustrated in the imaginary lines in FIG. 3) is required to cover the capacitors 28. The liquid metal 32 essentially does not touch the electric components mounted on the board 26, meaning that no sponge wall 36 (illustrated in the imaginary lines in FIG. 3) is required to surround the four sides of the substrate 22. In other words, the heat dissipation structure 10 does not require any insulating material 34 such as adhesive or sponge wall 36, thereby reducing the number of parts and assembly man-hours. For some design conditions or considering unforeseen circumstances, the heat dissipation structure 10 may include the insulating material 34, the sponge wall 36, or the like.

The inventor conducted an experiment to compare a heat dissipation structure where not only the liquid metal 32 but also the mesh 30 is interposed between the die 24 and the vapor chamber 16 as in the heat dissipation structure 10, with a heat dissipation structure where only the liquid metal 32 is interposed. The experiment showed no significant difference in heat transfer performance between them, confirming that the heat dissipation structure 10 has good heat transfer performance.

The experiment conducted by the inventor also shows that certain large vibrations and shocks caused the leakage of liquid metal 32 and a decrease in heat transfer performance in the structure with only the liquid metal 32 interposed, while no significant change was observed in the heat dissipation structure 10 before and after the experiment. This confirms that the heat dissipation structure 10 kept good performance.

The inventor also conducted a similar experiment for the structure where only heat-transfer grease, not liquid metal 32, was interposed between the die 24 and the vapor chamber 16. Although heat-transfer grease has lower fluidity than the liquid metal 32, it leaked somewhat and some deterioration was found in heat transfer performance. That is, a leakage from between the die 24 and the vapor chamber 16 due to vibrations is not a phenomenon unique to the liquid metal 32, but this is a phenomenon common to all heat-transfer fluids. The porous material of the heat dissipation structure 10 according to one or more embodiments may be impregnated with a heat-transfer fluid including heat-transfer grease, from which an effect of preventing the leakage can be obtained. The heat transfer fluid in the present application means not only liquid but also semi-solid and viscous substances having fluidity, and includes grease, oil compound, and the like. The material, thickness and diameter of the micropores of the porous material may be selected in accordance with the viscosity, fluidity, wettability, and other properties of the heat transfer fluid used for impregnation.

Figure 4:
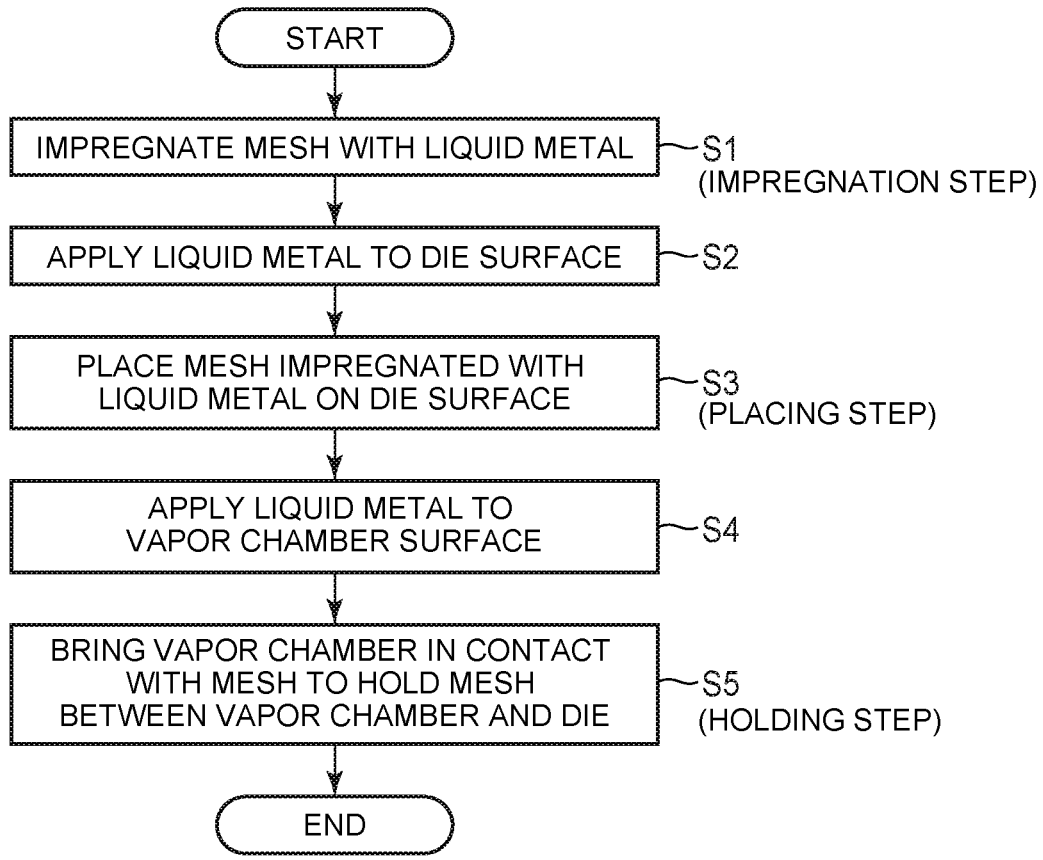
FIG. 4 is a flowchart of the method for manufacturing a heat dissipation structure.
Figure 5:
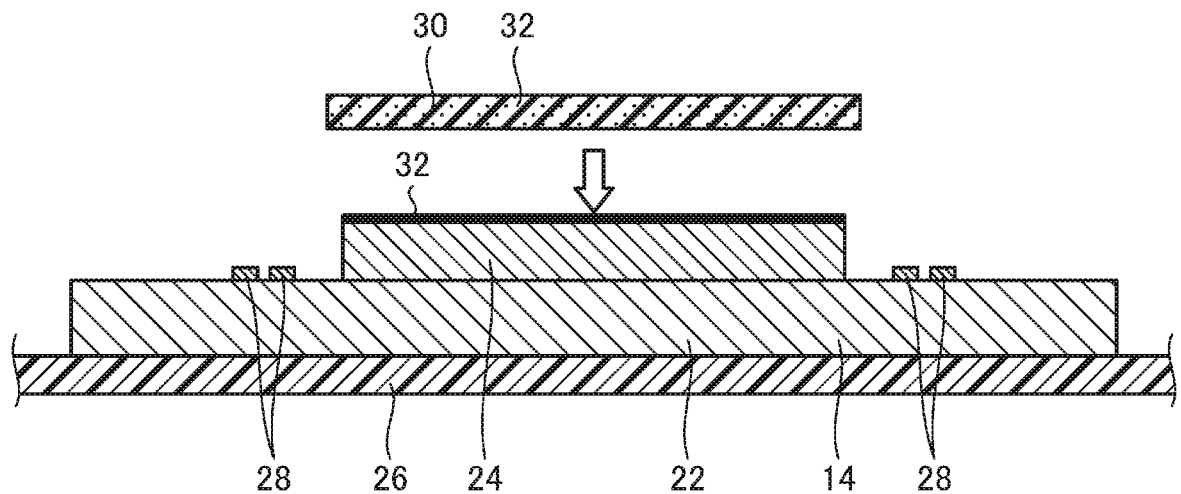
FIG. 5 is a schematic cross-sectional side view illustrating the placing step.
Figure 6:
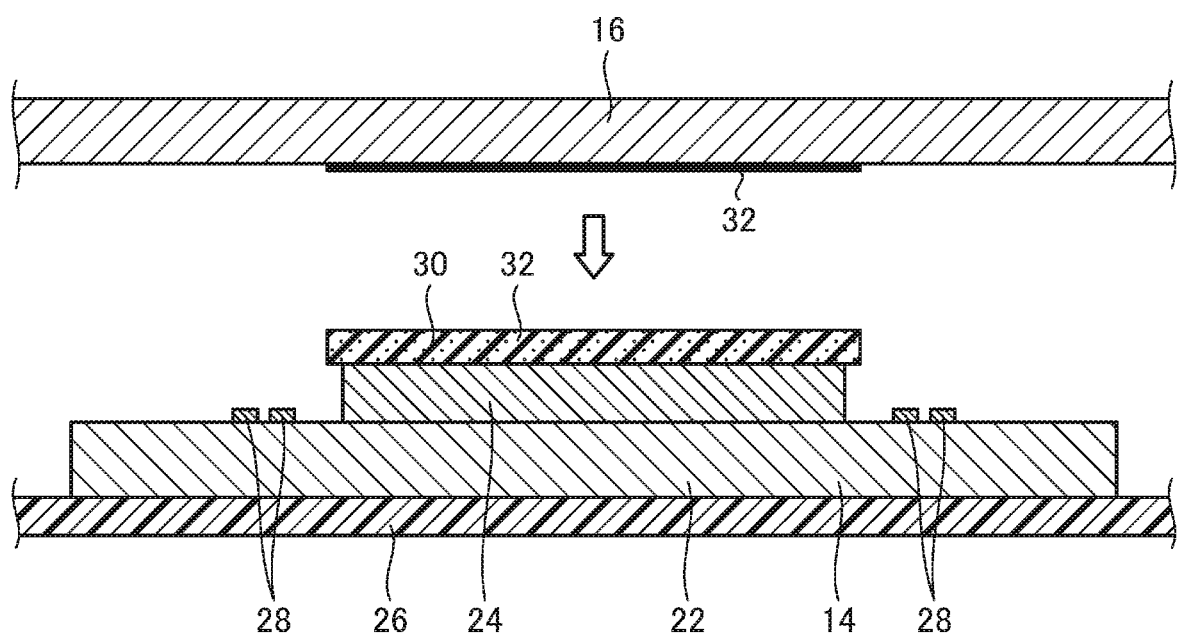
FIG. 6 is a schematic cross-sectional view illustrating the holding step.

Next the following describes a method for manufacturing the heat dissipation structure 10. FIG. 4 is a flowchart of the method for manufacturing the heat dissipation structure 10. FIG. 5 is a schematic cross-sectional side view illustrating the placing step. FIG. 6 is a schematic cross-sectional view illustrating the holding step. This manufacturing method of the heat dissipation structure 10 assumes that the GPU 14 is already mounted on the board 26 prior to the steps illustrated in FIG. 4. The board 26 may be assembled to the chassis of the portable information apparatus 12, or may be in a state before assembly.

In step S1 (impregnation step) of FIG. 4, the mesh 30 is impregnated with an appropriate amount of liquid metal 32. For impregnation, the mesh 30 may be immersed in a bath of the liquid metal 32, or the liquid metal 32 may be applied to the mesh 30. Although the liquid metal 32 may be difficult to permeate the mesh 30 for impregnation, the mesh 30 at this step is easy to handle because it is a single piece prior to assembly into the heat dissipation structure 10. Also, the six faces of the mesh 30, including the top, bottom, front, back, left, and right, are open, making it easy for the liquid metal 32 to permeate for impregnation. The mesh 30 is a single piece at this step, and thus the operator can inspect it visually or by a prescribed method to see if the mesh 30 is properly impregnated with the liquid metal 32.

In step S2, the surface of the die 24 is cleaned and an appropriate amount of liquid metal 32 is applied thereto. The liquid metal 32 essentially is applied to the entire surface of the die 24. Step S2 may be performed at any timing prior to the next step S3. FIG. 5 illustrates the liquid metal 32 applied to the surface of the die 24 with the bold line.

As illustrated in FIG. 5, in step S3 (placing step), the mesh 30 impregnated with liquid metal 32 is placed on the surface of the die 24. In this step, the liquid metal 32 applied to the die 24 and the liquid metal 32, with which the mesh 30 is impregnated, are mixed. This ensures that the liquid metal 32, with which the mesh 30 is impregnated, will be in contact with the surface of the die 24. Depending on conditions, for example, when the liquid metal 32 and the surface of the die 24 have good wettability, the preliminary step S2 may be omitted.

In step S4, the surface of the vapor chamber 16 is cleaned and an appropriate amount of liquid metal 32 is further applied thereto. The liquid metal 32 is applied to the portion of the vapor chamber 16 that is to be in contact with the mesh 30. In one or more embodiments, the portion to which the liquid metal 32 is applied is nickel-plated in advance. Step S4 may be performed at any timing prior to the next step S5. FIG. 6 illustrates the liquid metal 32 applied to the surface of the vapor chamber 16 with the bold line.

As illustrated in FIG. 6, in step S5 (holding step), the vapor chamber 16 is brought into contact with the mesh 30, so that the mesh 30 is held between the vapor chamber 16 and the die 24. The vapor chamber 16 is fixed to the board 26 and the chassis with screws or the like (see FIG. 1).

In this step, the liquid metal 32 applied to the vapor chamber 16 and the liquid metal 32, with which the mesh 30 is impregnated, are mixed. This ensures that the liquid metal 32, with which the mesh 30 is impregnated, will be in contact with the surface of the vapor chamber 16. Depending on conditions, for example, when the liquid metal 32 and the surface of the vapor chamber 16 have good wettability, the preliminary step S4 may be omitted.

Before this step, the mesh 30 is pre-impregnated with the liquid metal 32, meaning that there is no need to impregnate the mesh 30 deeply with the liquid metal 32 on the surface of the die 24 by step S2 and the liquid metal 32 on the surface of the vapor chamber 16 by step S4. Therefore, at this step, it is not necessary to press the vapor chamber 16 hard against the mesh 30 and press the die 24 for a long time for impregnation. If the mesh 30 were impregnated with the liquid metal 32 in this step, the mesh 30 would be covered with the vapor chamber 16, making it difficult to inspect the impregnation. In contrast, inspection will be easy if the impregnation is performed in step S1 beforehand.

Figure 7:
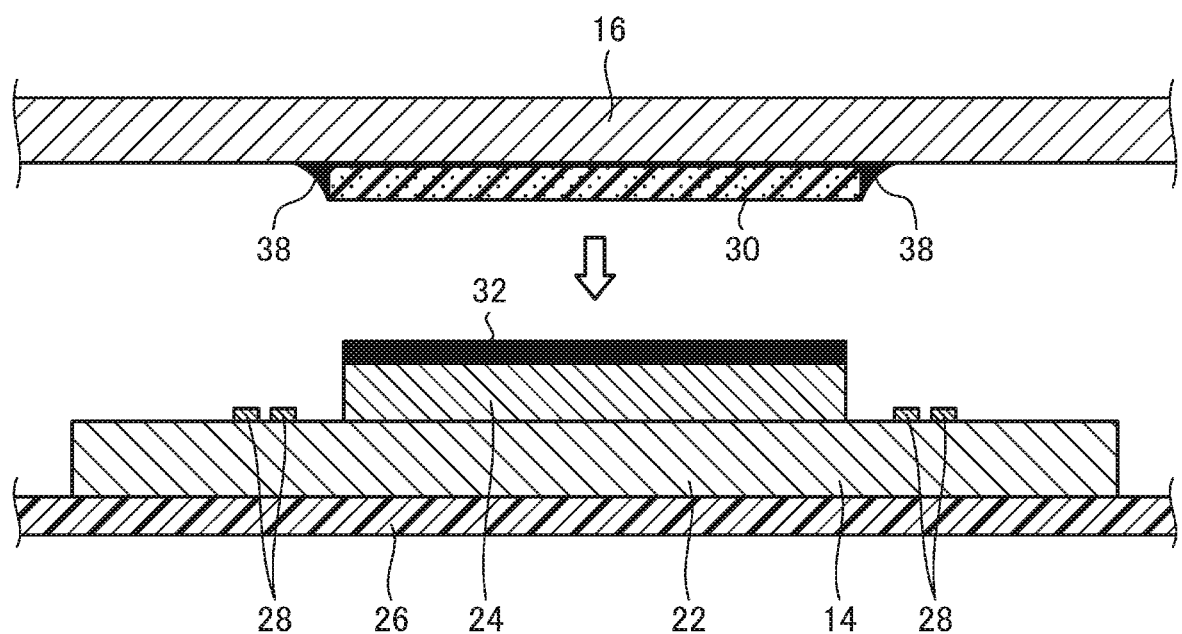
FIG. 7 is a schematic cross-sectional view of a step in a manufacturing method that is a modified example of the heat dissipation structure according to one or more embodiments.

FIG. 7 is a schematic cross-sectional view of a step in a manufacturing method that is a modified example of the heat dissipation structure 10. In this method, the periphery of the mesh 30 not impregnated with the liquid metal 32 is fixed to the vapor chamber 16, and this mesh 30 is brought into contact with the die 24 as it is. In this case, the mesh 30 is fixed to the vapor chamber 16 by soldering or caulking at its peripheral fixed portion 38.

In this method, one face of the mesh 30 is blocked by the vapor chamber 16. Thus, the fixed portion 38 may be provided intermittently rather than all the way around the mesh 30 to keep open spaces and help the air inside exhausted before impregnating the mesh 30 with the liquid metal 32 on the surface of the die 24.

To promote impregnation of the mesh 30 with the liquid metal 32 on the surface of the die 24, the following steps may be conducted: the vapor chamber 16 and the mesh 30 are pressed against the die 24 hard with a certain amount of force; the vapor chamber 16 and the mesh 30 are pressed against the die 24 for some length of time; and the pressing force of the vapor chamber 16 and mesh 30 may be varied over time. The fixed portion 38 has the effect of preventing the liquid metal 32, with which the mesh 30 is impregnated, from leaking out to the surroundings. The manufacturing method illustrated in FIGS. 4 to 7 also is applicable when sponge is used as the porous material or when grease is used as the heat-transfer fluid.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF SYMBOLS 10 heat dissipation structure
12 portable information apparatus (electronic apparatus)
16 vapor chamber (heat dissipator)
22 substrate
24 die (electric component)
28 capacitor
30 mesh (porous material)
32 liquid metal (heat-transfer fluid)

What is claimed is:

1. A heat dissipation structure for a heat-generating electric component, comprising:
    a heat dissipator disposed along a surface of the electric component; and
    a porous material held between the electric component and the heat dissipator, wherein
    the porous material being impregnated with heat-transfer fluid, and
    the porous material includes a metal material, and includes nickel at least on the surface.

2. The heat dissipation structure according to claim 1, wherein
    the heat-transfer fluid includes liquid metal.

3. The heat dissipation structure according to claim 1, wherein
    the porous material includes a mesh.

4. The heat dissipation structure according to claim 1, wherein
    the porous material includes a sponge.

5. The heat dissipation structure according to claim 1, further comprising
    a board and a semiconductor chip mounted on the board, wherein
    the semiconductor chip includes a substrate and a die, and the electric component includes the die.

6. An electronic apparatus comprising the heat dissipation structure according to claim 1.

7. A method for manufacturing a heat dissipation structure for a heat-generating electric component, comprising:
    an impregnation step of impregnating a porous material with heat-transfer fluid;
    a placing step of placing the porous material impregnated with the heat-transfer fluid on a surface of the electric component; and
    a holding step of bringing a heat dissipator into contact with the porous material and holding the porous material between the heat dissipator and the electric component, wherein
    the porous material includes a metal material, and includes nickel at least on the surface.

8. The method for manufacturing a heat dissipation structure according to claim 7, further comprising:
    prior to the placing step, a step of applying the heat-transfer fluid to the surface of the electric component.

9. The method for manufacturing a heat dissipation structure according to claim 7, further comprising:
    prior to the holding step, a step of applying the heat-transfer fluid to the surface of the heat dissipator.

10. A heat dissipation structure for a heat-generating electric component, comprising:
    a board and a semiconductor chip mounted on the board;
    a heat dissipator disposed along a surface of the electric component; and
    a porous material held between the electric component and the heat dissipator, wherein
    the porous material being impregnated with heat-transfer fluid,
    the semiconductor chip includes a substrate and a die, and the electric component includes the die.

11. A method for manufacturing a heat dissipation structure for a heat-generating electric component on a board, comprising:

an impregnation step of impregnating a porous material with heat-transfer fluid;
a placing step of placing the porous material impregnated with the heat-transfer fluid on a surface of the electric component; and
a holding step of bringing a heat dissipator into contact with the porous material and holding the porous material between the heat dissipator and the electric component, wherein
a semiconductor chip is mounted on the board,
the semiconductor chip includes a substrate and a die, and
the electric component includes the die.

* * * * *